United States Patent
Komiyama

(10) Patent No.: US 11,722,117 B2
(45) Date of Patent: Aug. 8, 2023

(54) ACOUSTIC WAVE RESONATOR, FILTER, MULTIPLEXER, AND WAFER

(71) Applicant: TAIYO YUDEN CO., LTD., Tokyo (JP)

(72) Inventor: Ryohei Komiyama, Tokyo (JP)

(73) Assignee: TAIO YUDEN CO., LTD., Tokyo (JP)

( * ) Notice: Subject to any disclaimer, the term of this patent is extended or adjusted under 35 U.S.C. 154(b) by 318 days.

(21) Appl. No.: 17/102,835

(22) Filed: Nov. 24, 2020

(65) Prior Publication Data

US 2021/0175871 A1   Jun. 10, 2021

(30) Foreign Application Priority Data

Dec. 6, 2019   (JP) .................................. 2019-221476

(51) Int. Cl.
| H03H 9/02 | (2006.01) |
| H03H 3/04 | (2006.01) |
| H03H 9/72 | (2006.01) |
| H10N 30/87 | (2023.01) |

(52) U.S. Cl.
CPC .......... *H03H 9/02574* (2013.01); *H03H 3/04* (2013.01); *H03H 9/02559* (2013.01); *H03H 9/02834* (2013.01); *H03H 9/725* (2013.01); *H10N 30/87* (2023.02); *H03H 2003/0407* (2013.01)

(58) Field of Classification Search
CPC .......... H03H 9/02574; H03H 9/02559; H03H 9/02834

USPC ...... 310/313 R, 313 A, 313 B, 313 C, 313 D
See application file for complete search history.

(56) References Cited

U.S. PATENT DOCUMENTS

| 2013/0285768 A1 | 10/2013 | Watanabe et al. ............ 333/193 |
| 2017/0033765 A1 | 2/2017 | Moriya et al. ..... H03H 9/02834 |
| 2017/0244387 A1 | 8/2017 | Matsuda et al. ........ H03H 9/725 |
| 2018/0159494 A1 | 6/2018 | Goto et al. .......... H03H 9/02559 |
| 2018/0159507 A1 | 6/2018 | Goto et al. ........... H03H 9/6489 |
| 2019/0393857 A1* | 12/2019 | Iwamoto ............... H04B 1/0057 |
| 2019/0393858 A1 | 12/2019 | Iwamoto et al. .. H03H 9/02866 |
| 2020/0403599 A1* | 12/2020 | Ito ........................... H01L 41/18 |

FOREIGN PATENT DOCUMENTS

| JP | 2015-073331 A | 4/2015 |
| JP | 2017-034363 A | 2/2017 |
| JP | 2017-152868 A | 8/2017 |
| JP | 2018-074575 A | 5/2018 |
| WO | WO 2018/163842 A1 | 9/2018 |

* cited by examiner

*Primary Examiner* — Derek J Rosenau
(74) *Attorney, Agent, or Firm* — Stein IP, LLC

(57) ABSTRACT

An acoustic wave resonator includes a support substrate, a piezoelectric layer that is disposed on the support substrate and is a rotated Y-cut X-propagation lithium tantalate of which a cut angle is within a range of greater than 50° and less than 150°, and a pair of comb-shaped electrodes disposed on the piezoelectric layer, each of the comb-shaped electrodes including a plurality of electrode fingers, an average pitch of the electrode fingers of one of the comb-shaped electrodes being equal to or greater than ½ of a thickness of the piezoelectric layer.

9 Claims, 15 Drawing Sheets

FIG. 3A
FIG. 3B
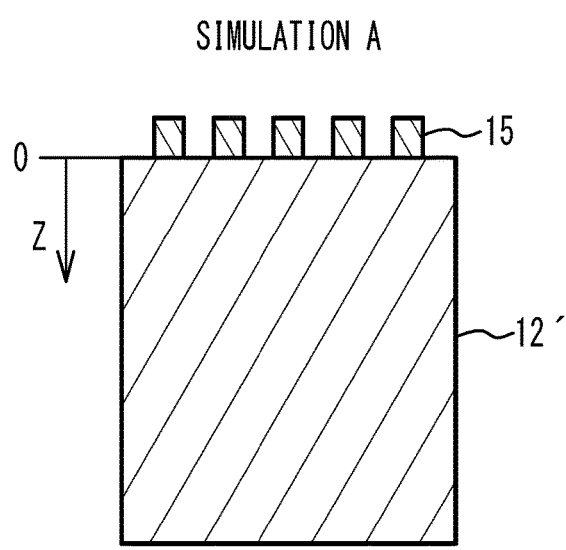
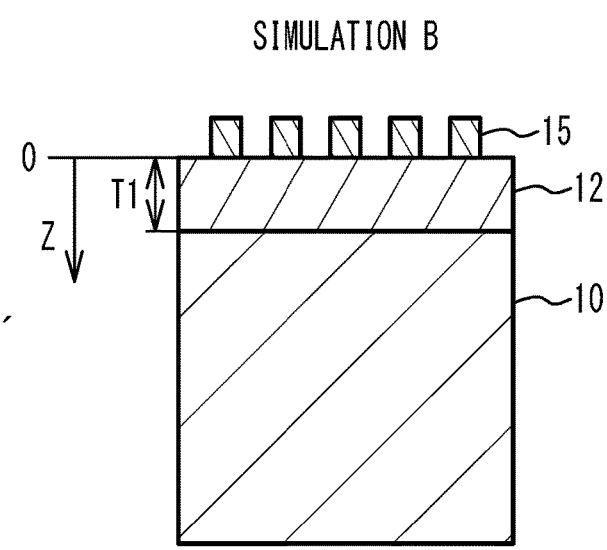

ACOUSTIC WAVE RESONATOR, FILTER, MULTIPLEXER, AND WAFER

CROSS-REFERENCE TO RELATED APPLICATION

This application is based upon and claims the benefit of priority of the prior Japanese Patent Application No. 2019-221476, filed on Dec. 6, 2019, the entire contents of which are incorporated herein by reference.

FIELD

A certain aspect of the present embodiments relates to an acoustic wave resonator, a filter, a multiplexer, and a wafer.

BACKGROUND

Surface acoustic wave resonators have been known as acoustic wave resonators used in communication devices such as smartphones. As disclosed in, for example, Japanese Patent Application Publication No. 2017-34363, it has been known that a piezoelectric layer forming the surface acoustic wave resonator is bonded to a support substrate, and the thickness of the piezoelectric layer is adjusted to be equal to or less than the wavelength of the surface acoustic wave. As disclosed in Japanese Patent Application Publication No. 2015-73331, it has been known that a silicon oxide layer is interposed between the support substrate and the piezoelectric layer. As disclosed in, for example, Japanese Patent Application Publication No. 2017-152868, it has been known that the temperature coefficient of the resonant frequency differs from the temperature coefficient of the antiresonant frequency in the surface acoustic wave resonator.

SUMMARY

To allow a filter constructed of the acoustic wave resonators to have desired characteristics, it is desired to reduce the difference between the temperature coefficient of the resonant frequency and the temperature coefficient of the antiresonant frequency in the acoustic wave resonator.

An objective of the present invention is to reduce the difference between the temperature coefficient of the resonant frequency and the temperature coefficient of the antiresonant frequency.

According to a first aspect of the present embodiments, there is provided an acoustic wave resonator including: a support substrate; a piezoelectric layer that is disposed on the support substrate and is a rotated Y-cut X-propagation lithium tantalate of which a cut angle is within a range of greater than 50° and less than 150°; and a pair of comb-shaped electrodes disposed on the piezoelectric layer, each of the comb-shaped electrodes including a plurality of electrode fingers, an average pitch of the electrode fingers of one of the comb-shaped electrodes being equal to or greater than ½ of a thickness of the piezoelectric layer.

According to a second aspect of the present embodiments, there is provided a filter including the above acoustic wave resonator.

According to a third aspect of the present embodiments, there is provided a multiplexer including the above filter.

According to a fourth aspect of the present embodiments, there is provided a wafer including: a support substrate; and a piezoelectric layer that is disposed on the support substrate, and is a rotated Y-cut X-propagation lithium tantalate of which a cut angle is within a range of greater than 50° and less than 150°.

BRIEF DESCRIPTION OF THE DRAWINGS

FIG. 3A and FIG. 3B are cross-sectional views of the acoustic wave resonator in simulations A and B, respectively;

DETAILED DESCRIPTION

Hereinafter, a description will be given of embodiments of the present invention with reference to the accompanying drawings.

First Embodiment

Figure 1A:
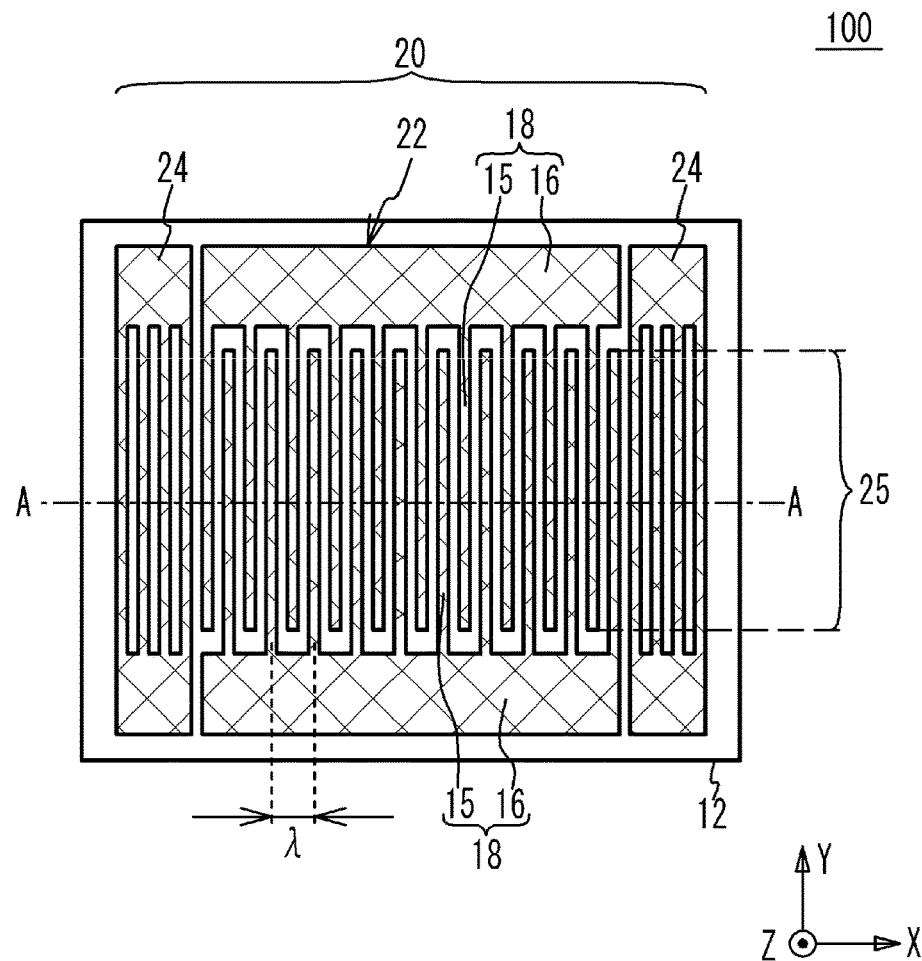
FIG. 1A is a plan view of an acoustic wave resonator in accordance with a first embodiment.
Figure 1B:
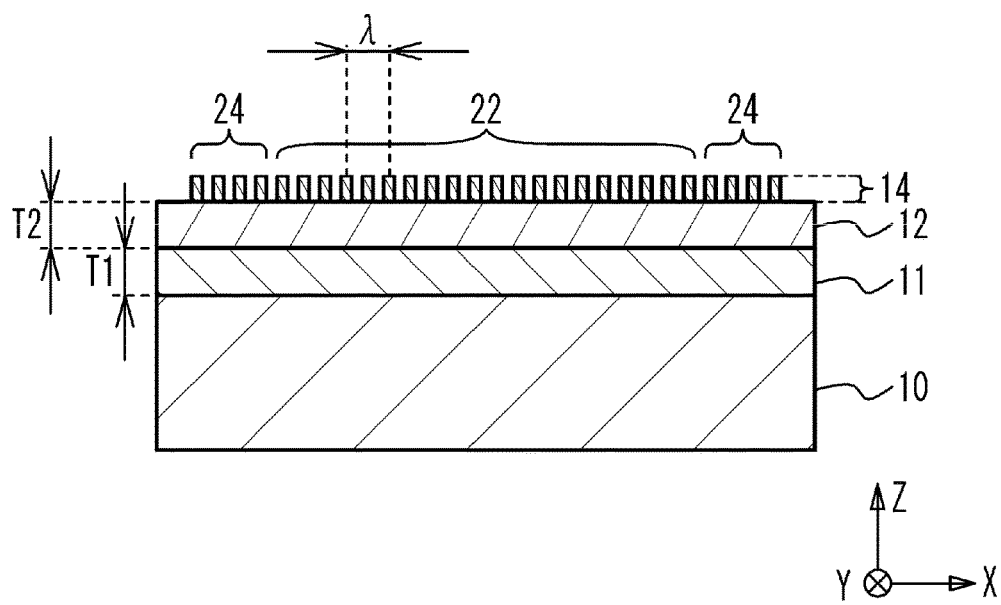
FIG. 1B is a cross-sectional view taken along line A-A in in FIG. 1A.

FIG. 1A is a plan view of an acoustic wave resonator in accordance with a first embodiment, and FIG. 1B is a cross-sectional view taken along line A-A in FIG. 1A. The direction in which electrode fingers are arranged (the arrangement direction) is defined as an X direction, the direction in which the electrode fingers extend (the extension direction) is defined as a Y direction, and the direction in which a support substrate and a piezoelectric layer are stacked (the stack direction) is defined as a Z direction. The X direction, the Y direction, and the Z direction do not necessarily correspond to the X-axis orientation and the Y-axis orientation of the crystal orientation of the piezoelectric layer. When the piezoelectric layer is a rotated Y-cut X-propagation layer, the X direction is the X-axis orientation of the crystal orientation.

As illustrated in FIG. 1A and FIG. 1B, in an acoustic wave resonator 100 of the first embodiment, an insulating layer 11 is bonded on a support substrate 10. A piezoelectric layer 12 is bonded on the insulating layer 11. The insulating layer 11 may be directly bonded on the support substrate 10, or may be indirectly bonded on the support substrate 10 with a bonding layer or other layers interposed therebetween. The piezoelectric layer 12 may be directly bonded on the insulating layer 11, or may be indirectly bonded on the insulating layer 11 with a bonding layer or other layers interposed therebetween. An acoustic wave element 20 is disposed on the piezoelectric layer 12. The acoustic wave element 20 includes an interdigital transducer (IDT) 22 and reflectors 24. The reflectors 24 are disposed at both sides of the IDT 22 in the X direction. The IDT 22 and the reflectors 24 are formed of a metal film 14 on the piezoelectric layer 12.

The IDT 22 includes a pair of comb-shaped electrodes 18 facing each other. Each comb-shaped electrode 18 includes a plurality of electrode fingers 15 and a bus bar 16 to which the electrode fingers 15 are connected. The region where the electrode fingers 15 of one of the comb-shaped electrodes 18 overlap the electrode fingers 15 of the other of the comb-shaped electrodes 18 is an overlap region 25. The length of the overlap region 25 is an aperture length. A pair of the comb-shaped electrodes 18 is arranged so as to face each other in a manner such that the electrode fingers 15 of one of the comb-shaped electrodes 18 and the electrode fingers 15 of the other of the comb-shaped electrodes 18 are substantially alternated in at least a part of the overlap region 25. The acoustic wave excited by the electrode fingers 15 in the overlap region 25 propagates mainly in the X direction. The pitch of the electrode fingers 15 of one of the comb-shaped electrodes 18 is substantially equal to the wavelength $\lambda$ of the acoustic wave. That is, the wavelength $\lambda$ of the acoustic wave is substantially equal to two times the pitch of the electrode fingers 15 of a pair of the comb-shaped electrodes 18. The reflectors 24 reflect the acoustic wave (a surface acoustic wave) excited by the electrode fingers 15 of the IDT 22. Thus, the acoustic wave is confined in the overlap region 25 of the IDT 22.

The piezoelectric layer 12 is a monocrystal lithium tantalate ($LiTaO_3$) layer, and is a rotated Y-cut X-propagation lithium tantalate layer. The insulating layer 11 is an insulating layer containing silicon oxide (SiO). The insulating layer 11 may be a silicon dioxide ($SiO_2$) layer, or may be mainly composed of silicon oxide and contain impurities such as fluorine or nitrogen (for example, a SiOF layer or a SiON layer). The temperature coefficient of the elastic constant of the insulating layer 11 is opposite in sign to the temperature coefficient of the elastic constant of the piezoelectric layer 12. When temperature coefficient of the elastic constant of the insulating layer 11 is adjusted to be opposite in sign to the temperature coefficient of the elastic constant of the piezoelectric layer 12, the small temperature coefficient of frequency (TCF) of the acoustic wave resonator is achieved.

The support substrate 10 has a linear expansion coefficient smaller than the linear expansion coefficient in the X direction of the piezoelectric layer 12. Use of the material having a linear expansion coefficient smaller than the linear expansion coefficient of the piezoelectric layer 12 as the support substrate 10 reduces the variation in the pitch of the electrode fingers 15 due to the variation in temperature, and thereby the TCF of the acoustic wave resonator can be reduced. The support substrate 10 is, for example, a sapphire substrate, an alumina substrate, a silicon substrate, a spinel substrate, a crystal substrate, a quartz substrate, or a silicon carbide substrate. The sapphire substrate is a substrate containing monocrystal $Al_2O_3$ as a main component. The alumina substrate is a substrate containing polycrystalline $Al_2O_3$ as a main component. The silicon substrate is a substrate containing monocrystal Si or polycrystalline Si as a main component. The spinel substrate is a substrate containing monocrystal $MgAl_2O_4$ or polycrystalline $MgAl_2O_4$ as a main component. The crystal substrate is a substrate containing monocrystal $SiO_2$ as a main component. The quartz substrate is a substrate containing amorphous $SiO_2$ as a main component. The silicon carbide substrate is a substrate containing monocrystal SiC or polycrystalline SiC as a main component. The main component is a component of which the total concentration of atoms in the substrate is 50 atomic % or greater, or the component of which the total concentration of atoms is 80 atomic % or greater.

The metal film 14 is a film containing, for example, aluminum, copper, or molybdenum as a main component, and is, for example, an aluminum film, a copper film, or a molybdenum film. An adhesion film such as a titanium film or a chrome film may be interposed between the electrode fingers 15 and the piezoelectric layer 12. The adhesion film is thinner than the electrode finger 15. An insulating film may be provided so as to cover the electrode fingers 15. The insulating film may act as a protective film or a temperature compensation film.

The support substrate 10 has a thickness of, for example, 50 μm to 500 μm. The thickness T1 of the insulating layer 11 is, for example, 0.1 μm to 10 μm, and is equal to or less than, for example, the wavelength $\lambda$ of the acoustic wave. The thickness T2 of the piezoelectric layer 12 is, for example, 0.1 μm to 10 μm, and is equal to or less than, for example, the wavelength $\lambda$ of the acoustic wave. The wavelength $\lambda$ of the acoustic wave is, for example, 1 μm to 6 μm. When two electrode fingers 15 are defined as one pair of the electrode fingers 15, the number of pairs of the electrode fingers 15 is 20 pairs to 300 pairs. The duty ratio of the IDT 22 is calculated by dividing the width of the electrode finger 15 by the pitch of the electrode fingers 15, and is, for example, 30% to 80%. The aperture length of the IDT 22 is, for example, 10$\lambda$ to 50$\lambda$.

Manufacturing Method

A description will be given of a manufacturing method of the acoustic wave resonator 100. The insulating layer 11 is formed on the support substrate 10 using the chemical vapor deposition (CVD) method. After a piezoelectric substrate is bonded on the insulating layer 11 using the surface activation method, the piezoelectric substrate is thinned by chemical mechanical polishing (CMP) to form the piezoelectric layer 12. The IDT 22 and the reflectors 24 are formed on the piezoelectric layer 12.

Description of the Thicknesses of the Insulating Layer 11 and the Piezoelectric Layer 12

Figure 2:
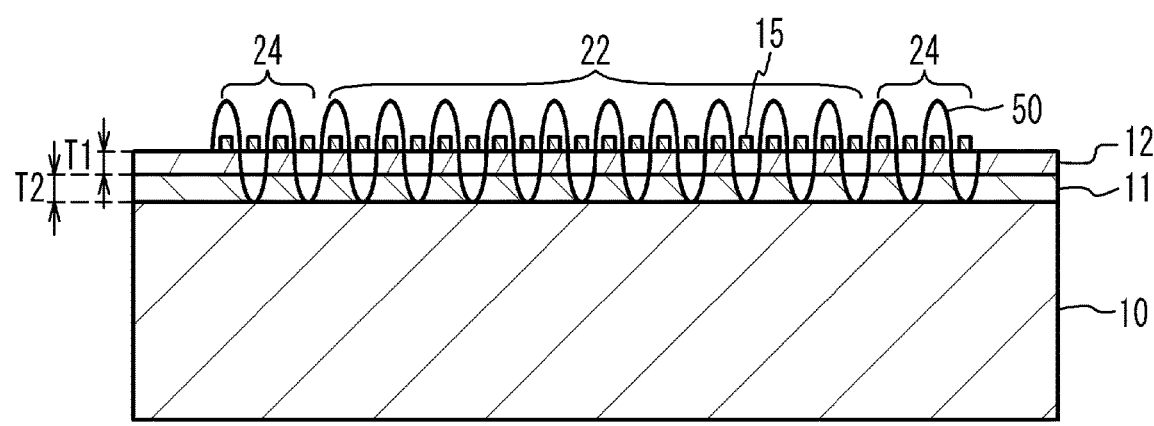
FIG. 2 is a cross-sectional view for describing an acoustic wave.

A description will be given of the thickness T1 of the insulating layer 11 and the thickness T2 of the piezoelectric layer 12. FIG. 2 is a cross-sectional view for describing the acoustic wave. As illustrated in FIG. 2, the electrode fingers 15 of the IDT 22 excites an acoustic wave 50. The acoustic wave 50 in the drawing illustrates an image of displacement, and is different from the actual displacement of the acoustic wave. When the piezoelectric layer 12 is a rotated Y-cut X-propagation lithium tantalate layer, the IDT 22 excites mainly a shear horizontal (SH) wave. The SH wave is a wave that is displaced in the direction that is parallel to the surface of the piezoelectric layer 12 and orthogonal to the propagation direction of the SH wave. To reduce the TCF of the acoustic wave resonator, the displacement of the surface acoustic wave is required to be distributed in the insulating layer 11.

Thus, the total displacement distribution at the resonant frequency was simulated. FIG. 3A and FIG. 3B are cross-sectional views of acoustic wave resonators in simulations A and B, respectively. As illustrated in FIG. 3A, in the simulation A, a piezoelectric substrate 12' made of 42° rotated Y-cut X-propagation lithium tantalate was used. As illustrated in FIG. 3B, in the simulation B, used was a substrate in which the piezoelectric layer 12 made of 42° rotated Y-cut X-propagation lithium tantalate was disposed on the support substrate 10 made of sapphire. The thickness T1 of the piezoelectric layer 12 was set at approximately 0.7λ. In both the simulations A and B, the surfaces of the piezoelectric substrate 12' and the piezoelectric layer 12 with which the electrode fingers 15 are in contact were defined as 0, and the position in the depth direction of the substrate was defined as a position Z.

Figure 4A:
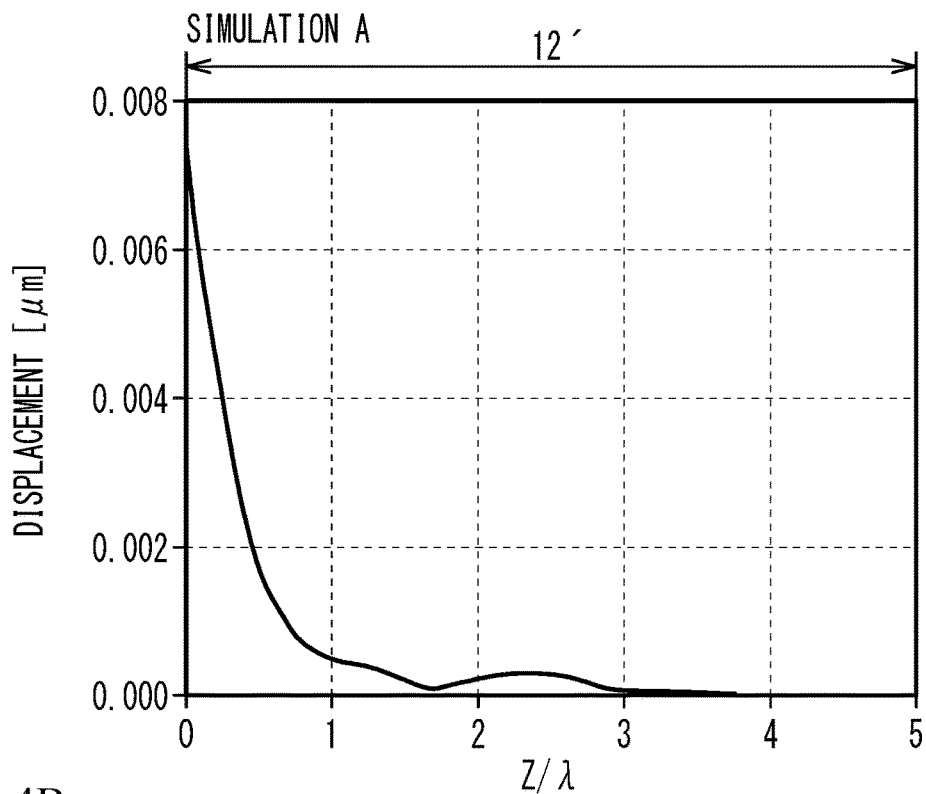
FIG. 4A and FIG. 4B are graphs of total displacement distribution versus a position Z in the simulations A and B, respectively.
Figure 4B:
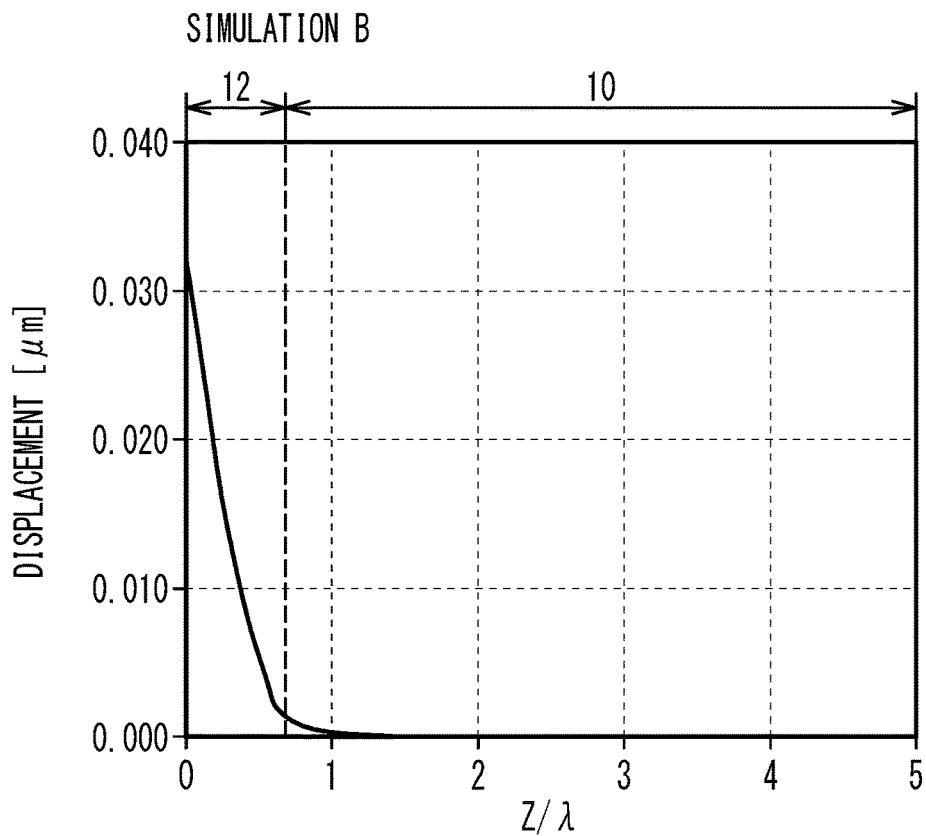

FIG. 4A and FIG. 4B are graphs of the total displacement distribution versus the position Z in the simulations A and B, respectively. In the top part of FIG. 4A and FIG. 4B, arrows indicating the regions of the piezoelectric substrate 12', the support substrate 10, and the piezoelectric layer 12 are illustrated. As presented in FIG. 4A, in the simulation A, most of displacements are distributed within a range of Z/λ of 2 or less. In particular, most of displacements are within a range of Z/λ of 1.5 or less. This indicates that the surface acoustic wave propagates through the region from the surface of the piezoelectric substrate 12' to 2λ (particularly, 1.5λ) in depth. As presented in FIG. 4B, in the simulation B, most of displacements are distributed within a range of Z/λ of 1 or less. In particular, displacements are distributed very little within the support substrate 10. This is because the phase velocity of the support substrate 10 is large.

As clear from the above simulation results, the surface acoustic wave propagates through the region from the surface of the piezoelectric substrate 12' to 2λ (in particular, 1.5λ) in depth. This reveals that the insulating layer 11 is required to exist within the region from the upper surface of the piezoelectric layer 12 to 2λ (particularly, 1.5λ) in depth to allow the insulating layer 11 to have an ability to reduce the TCF in the first embodiment.

Figure 5A:
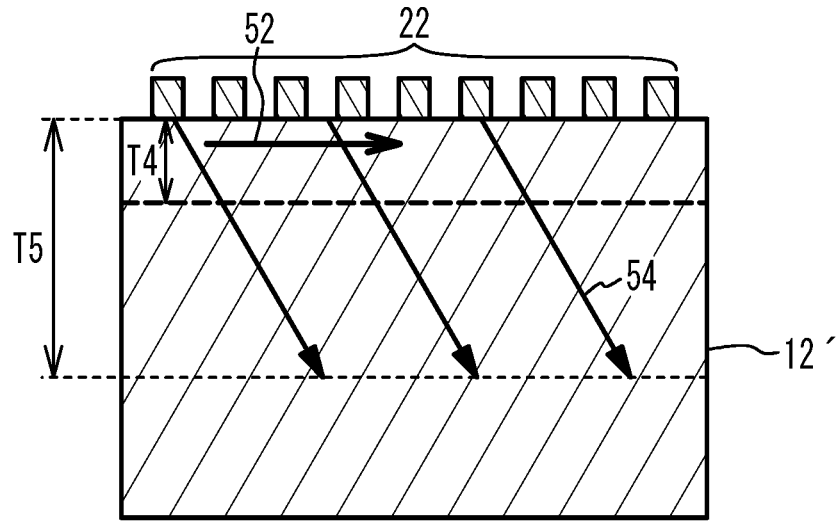
FIG. 5A to FIG. 5C are cross-sectional views for describing a bulk wave.
Figure 5B:
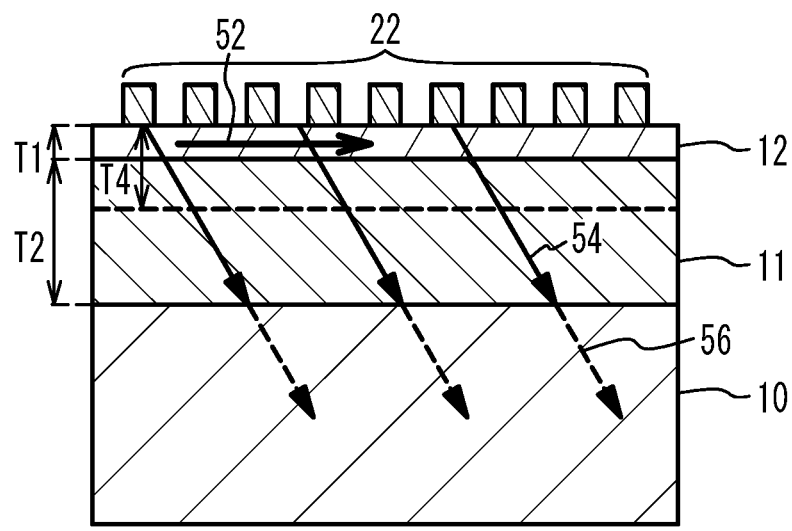
Figure 5C:
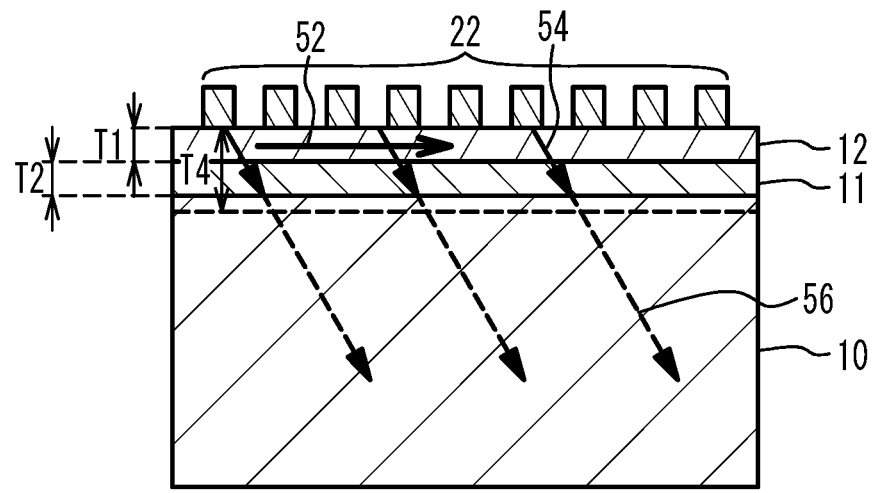

Next, a bulk wave will be described. FIG. 5A to FIG. 5C are cross-sectional views for describing a bulk wave. As illustrated in FIG. 5A, when the piezoelectric substrate 12' is used, the IDT 22 excites a surface acoustic wave 52 such as an SH wave on the surface of the piezoelectric substrate 12'. The thickness T4 within which the displacement of the surface acoustic wave 52 exists is approximately 2λ. When the IDT 22 excites the surface acoustic wave 52, the IDT 22 emits a bulk wave 54 within the piezoelectric substrate 12'.

The magnitude of the bulk wave 54 is approximately 1/10 of the magnitude of the surface acoustic wave 52 in the primary mode. The thickness T5 of the region where the bulk wave 54 exists is approximately 10λ. When the bulk wave 54 propagates through the piezoelectric substrate 12', the energy of the surface acoustic wave 52 is lost as the bulk wave 54. Thus, the loss of the acoustic wave resonator increases.

As illustrated in FIG. 5B, the insulating layer 11 of which the temperature coefficient of the elastic constant is opposite in sign to that of the piezoelectric layer 12 is disposed on the support substrate 10, and the piezoelectric layer 12 is disposed on the insulating layer 11. The thickness T1 of the piezoelectric layer 12 is less than the thickness T4. Thus, displacement of the surface acoustic wave 52 is distributed in both the piezoelectric layer 12 and the insulating layer 11. Therefore, the temperature coefficient of frequency is reduced. When the thickness T2 of the insulating layer 11 is large, the bulk wave 54 propagates through the insulating layer 11. Thus, the energy of the surface acoustic wave 52 is lost as the bulk wave 54. Therefore, the loss of the acoustic wave resonator increases. As indicated by arrows 56, no bulk wave propagates through the support substrate 10.

As illustrated in FIG. 5C, in the first embodiment, the insulating layer 11 is thinned, and the sum of the thicknesses T1 and T2 (i.e., the distance between the upper surface of the piezoelectric layer 12 and the lower surface of the insulating layer 11) is reduced to T4 or less. The support substrate 10 has a phase velocity (an acoustic velocity) greater than the phase velocities of the insulating layers 11 and the piezoelectric layers 12. For example, the phase velocity of the faster lateral wave of lithium tantalate is approximately 4211 m/s, the phase velocity of the faster lateral wave of silicon dioxide is approximately 5840 m/s, and the phase velocity of the faster lateral wave of sapphire is approximately 6761 m/s. Thus, as indicated by the arrows 56, it is difficult for the bulk wave to propagate through the support substrate 10. The surface acoustic wave 52 and the bulk wave 54 are both confined in the piezoelectric layer 12 and the insulating layer 11. Therefore, the loss of the acoustic wave resonator is reduced. In addition, spurious emissions due to the bulk wave are reduced.

Description of the Cut Angle of the Piezoelectric Layer 12

A description will be given of a simulation in which the cut angle of the piezoelectric layer 12 was varied and the temperature coefficient of the resonant frequency fr and the temperature coefficient of the antiresonant frequency fa and the electromechanical coupling coefficient (k2) were calculated. The simulation was conducted under the following conditions using the structure illustrated in FIG. 1A and FIG. 1B.

Support substrate 10: Sapphire substrate

Insulating layer 11: Silicon dioxide layer with a thickness of 600 nm (0.4λ)

Piezoelectric layer 12: Rotated Y-cut X-propagation lithium tantalate layer with a thickness of 600 nm (0.4λ)

Metal film 14: Aluminum film with a thickness of 150 nm

Pitch of the electrode fingers 15×2: 1500 nm (the wavelength λ of the acoustic wave)

Width of the electrode fingers 15: 375 nm

Figure 6:
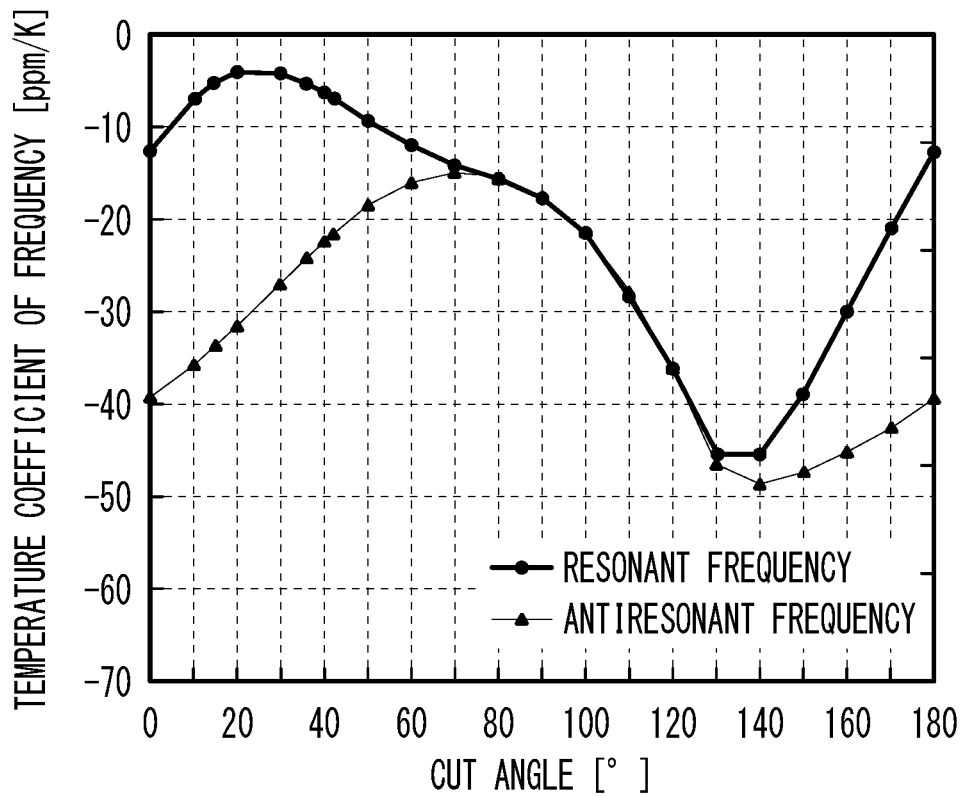
FIG. 6 is a graph of a temperature coefficient of frequency versus the cut angle of a piezoelectric layer.

FIG. 6 is a graph of the TCF versus the cut angle of the piezoelectric layer. The horizontal axis represents the cut angle of the piezoelectric layer 12, and the vertical axis represents the TCF. Dots represent simulated points, and the curve line is an approximate curve (the same applies to the similar drawings, hereinafter). The simulation results of the resonant frequency fr are indicated by a bold line, and the simulation results of the antiresonant frequency fa are indicated by a thin line. The TCF was obtained from the difference between the frequency when the temperature of the acoustic wave resonator is 25° C. and the frequency when the temperature of the acoustic wave resonator is 85° C.

As illustrated in FIG. 6, in a range of the cut angle of the piezoelectric layer 12 of 0° to 80°, the temperature coefficient of the antiresonant frequency fa is smaller than the temperature coefficient of the resonant frequency fr. The difference between the temperature coefficient of the resonant frequency fr and the temperature coefficient of the antiresonant frequency fa decreases as the cut angle of the piezoelectric layer 12 increases from 0°, and is very little at 80°. In a range of the cut angle of the piezoelectric layer 12 between 80° to 120°, the temperature coefficient of the resonant frequency fr and the temperature coefficient of the antiresonant frequency fa follow a similar trajectory while maintaining substantially no difference. When the cut angle of the piezoelectric layer 12 exceeds 120°, the difference between the temperature coefficient of the resonant frequency fr and the temperature coefficient of the antiresonant frequency fa starts increasing, and the temperature coefficient of the antiresonant frequency fa is smaller than the temperature coefficient of the resonant frequency fr.

Figure 7:
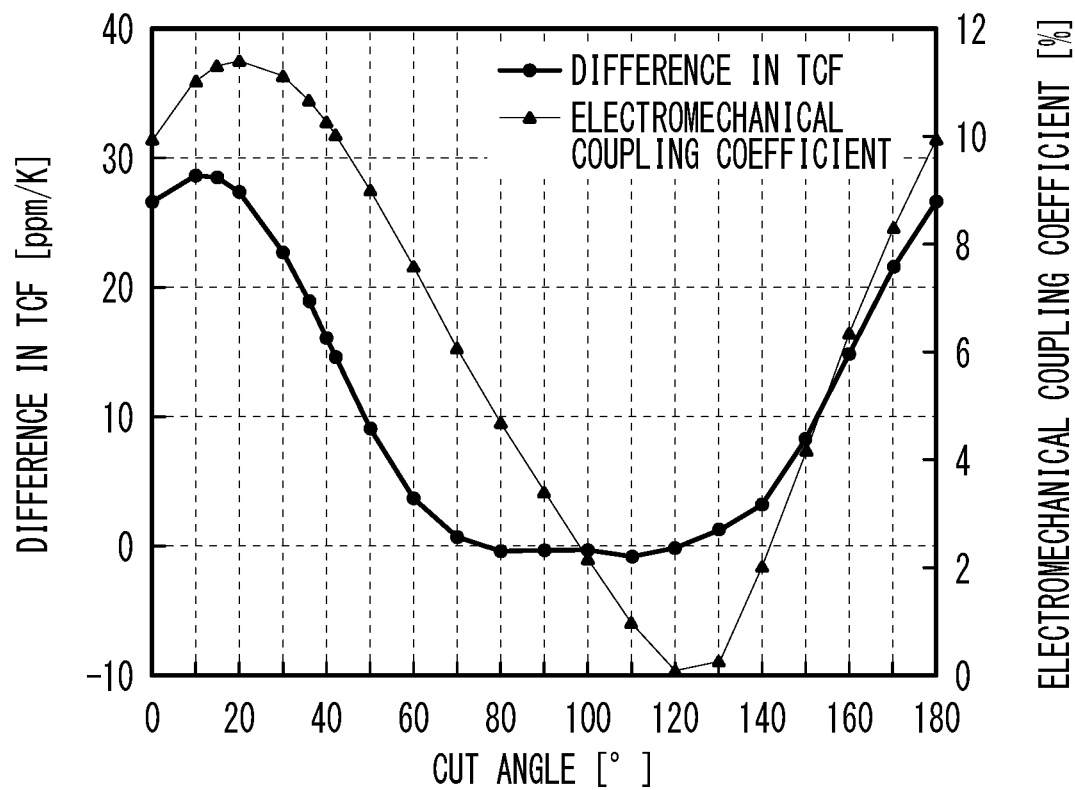
FIG. 7 is a graph of a difference between the temperature coefficient of the resonant frequency and the temperature coefficient of the antiresonant frequency and an electromechanical coupling coefficient versus the cut angle of the piezoelectric layer.

FIG. 7 is a graph of the difference between the temperature coefficient of the resonant frequency and the temperature coefficient of the antiresonant frequency and the electromechanical coupling coefficient versus the cut angle of the piezoelectric layer. The horizontal axis represents the cut angle of the piezoelectric layer 12, the left-hand vertical axis represents the difference (fr−fa) between the temperature coefficient of the resonant frequency fr and the temperature coefficient of the antiresonant frequency fa, and the right-hand vertical axis represents the electromechanical coupling coefficient. The difference in TCF is indicated by a bold line, and the electromechanical coupling coefficient is indicated by a thin line.

As illustrated in FIG. 7, in a range of the cut angle of the piezoelectric layer 12 of greater than 50° and less than 150°, the absolute value of the difference between the temperature coefficient of the resonant frequency fr and the temperature coefficient of the antiresonant frequency fa is maintained low, 10 ppm/K or less. In particular, in a range of the cut angle of the piezoelectric layer 12 of 80° or greater and 120° or less, the difference between the temperature coefficient of the resonant frequency fr and the temperature coefficient of the antiresonant frequency fa is approximately zero. On the other hand, the electromechanical coupling coefficient is the largest when the cut angle of the piezoelectric layer 12 is 20°, is approximately zero when the cut angle is 120°, and decreases as the cut angle increases when the cut angle is between 20° and 120°.

As seen above, when the total thickness of the insulating layer 11 and the piezoelectric layer 12 is 2λ or less such as 0.8λ (i.e., the distance between the upper surface of the piezoelectric layer 12 and the lower surface of the insulating layer 11 is 2λ or less), the absolute value of the difference in TCF is maintained low, 10 ppm/K or less by adjusting the cut angle of the piezoelectric layer 12 to be greater than 50° and less than 150°. In particular, when the cut angle of the piezoelectric layer 12 is adjusted to be 80° or greater and 120° or less, the difference in TCF becomes approximately zero.

Next, the difference between the temperature coefficient of the resonant frequency fr and the temperature coefficient of the antiresonant frequency fa and the electromechanical coupling coefficient with respect to the cut angle of the piezoelectric layer 12 are compared between the case where the insulating layer 11 is provided and the case where no insulating layer 11 is provided. The simulation for the case where the insulating layer 11 is provided was conducted under the conditions identical to those in FIG. 6 and FIG. 7. The simulation for the case where no insulating layer 11 is provided was conducted under the conditions identical to those in FIG. 6 and FIG. 7 except in that no insulating layer 11 was provided.

Figure 8A:
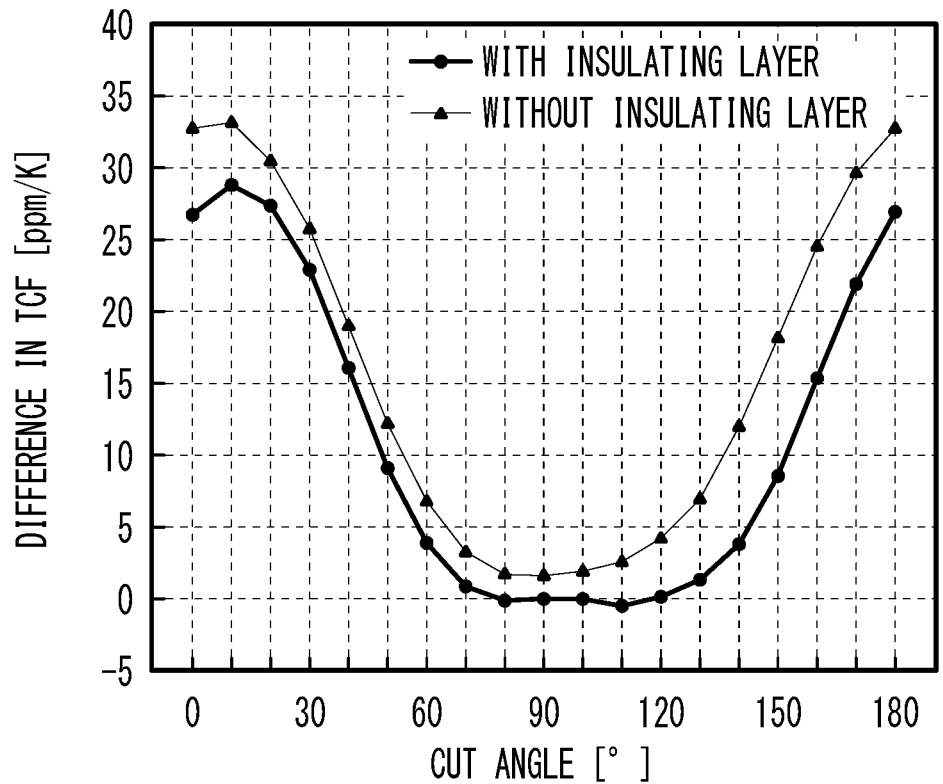
FIG. 8A presents comparison of the difference between the temperature coefficient of the resonant frequency and the temperature coefficient of the antiresonant frequency with respect to the cut angle of the piezoelectric layer between the case where an insulating layer is provided and the case where no insulating layer is provided.
Figure 8B:
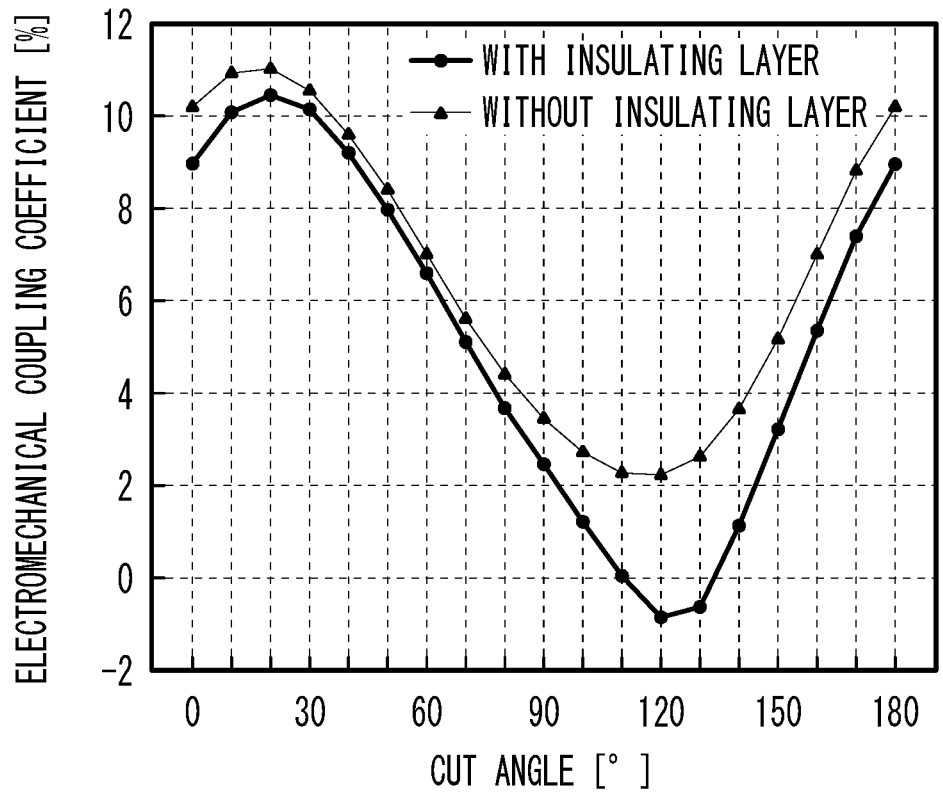
FIG. 8B presents comparison of the electromechanical coupling coefficient with respect to the cut angle of the piezoelectric layer between the case where an insulating layer is provided and the case where no insulating layer is provided.

FIG. 8A illustrates comparison of the difference between the temperature coefficient of the resonant frequency and the temperature coefficient of the antiresonant frequency with respect to the cut angle of the piezoelectric layer between the case where the insulating layer is provided and the case where no insulating layer is provided, and FIG. 8B illustrates comparison of the electromechanical coupling coefficient with respect to the cut angle of the piezoelectric layer between the case where the insulating layer is provided and the case where no insulating layer is provided. In FIG. 8A and FIG. 8B, the horizontal axis represents the cut angle of the piezoelectric layer 12. The vertical axis in FIG. 8A represents the difference (fr−fa) between the temperature coefficient of the resonant frequency fr and the temperature coefficient of the antiresonant frequency fa, and the vertical axis in FIG. 8B represents the electromechanical coupling coefficient. The case where the insulating layer 11 is provided is indicated by a bold line, while the case where no insulating layer 11 is provided is indicated by a thin line.

As presented in FIG. 8A, in the entire range of the cut angle of the piezoelectric layer 12, the absolute value of the difference in TCF when the insulating layer 11 is provided is less than the absolute value of the difference in TCF when no insulating layer 11 is provided. In a range of the cut angle of the piezoelectric layer 12 of 80° or greater and 120° or less, the difference in TCF is approximately zero in the case where the insulating layer 11 is provided, while the difference in TCF is not zero but is approximately 2 to 5 ppm/Ka in the case where no insulating layer 11 is provided.

As presented in FIG. 8B, in the entire range of the cut angle of the piezoelectric layer 12, the electromechanical coupling coefficient when the insulating layer 11 is provided is less than the electromechanical coupling coefficient when no insulating layer 11 is provided, but in a range of the cut angle of the piezoelectric layer 12 of 30° or greater and 90° or less, the difference in electromechanical coupling coefficient is small.

As described above, in the first embodiment, to achieve the small difference in TCF and reduce the loss and spurious emissions, the distance between the upper surface of the piezoelectric layer 12 and the lower surface of the insulating layer 11 is adjusted to be 2λ or less. In other words, the average pitch of the electrode fingers 15 of one of the comb-shaped electrodes 18 is adjusted to be equal to or greater than ½ of the distance between the upper surface of the piezoelectric layer 12 and the lower surface of the insulating layer 11. The average pitch of the electrode fingers 15 of one of the comb-shaped electrodes 18 can be calculated by dividing the length in the X direction of one of the comb-shaped electrodes 18 by the number of the electrode fingers 15 of one of the comb-shaped electrodes 18. The average pitch of the electrode fingers 15 of one of the comb-shaped electrodes 18 may be the value calculated by dividing the length in the X direction of the IDT 22 by the number of pairs of the electrode fingers 15 (½ of the number of the electrode fingers 15). In such a case, as illustrated in FIG. 7, the cut angle of the piezoelectric layer 12 is adjusted to be within a range of greater than 50° and less than 150°. This reduces the absolute value of the difference between the temperature coefficient of the resonant frequency fr and the temperature coefficient of the antiresonant frequency fa of the acoustic wave resonator. As illustrated in FIG. 8A, by providing the insulating layer 11, the absolute value of the difference in TCF is adjusted to be less than the absolute value of the difference in TCF when no insulating layer 11 is provided. To cause the surface acoustic wave to propagate through the piezoelectric layer 12 and the insulating layer 11, the average pitch of the electrode fingers 15 of one of the comb-shaped electrodes 18 is preferably equal to or less than 1/0.1 times the total thickness of the insulating layer 11 and the piezoelectric layer 12, more preferably equal to or less than 1/0.5 times the total thickness of the insulating layer 11 and the piezoelectric layer 12, further preferably equal to or less than 1 times the total thickness of the insulating layer 11 and the piezoelectric layer 12.

The cut angle of the piezoelectric layer 12 expressed in an Euler's angle representation is (φ, θ, ψ)=(0°, 140° to 240°, 0°), and may be (φ, θ, ψ)=(0°±5°, 140° to 240°, 0°±10°) in consideration of the production errors.

As illustrated in FIG. 7, to ensure the electromechanical coupling coefficient and reduce the difference in TCF, the cut angle of the piezoelectric layer 12 is preferably greater than 50° and 90° or less, more preferably 55° or greater and 90° or less, further preferably greater than 50° and 70° or less, yet further preferably 55° or greater and 70° or less. In addition, to ensure the electromechanical coupling coefficient and further reduce the difference in TCF, the cut angle of the piezoelectric layer 12 may be 60° or greater and 90° or less, may be 60° or greater and 80° or less, or may be 70° or greater and 90° or less.

Figure 9A:
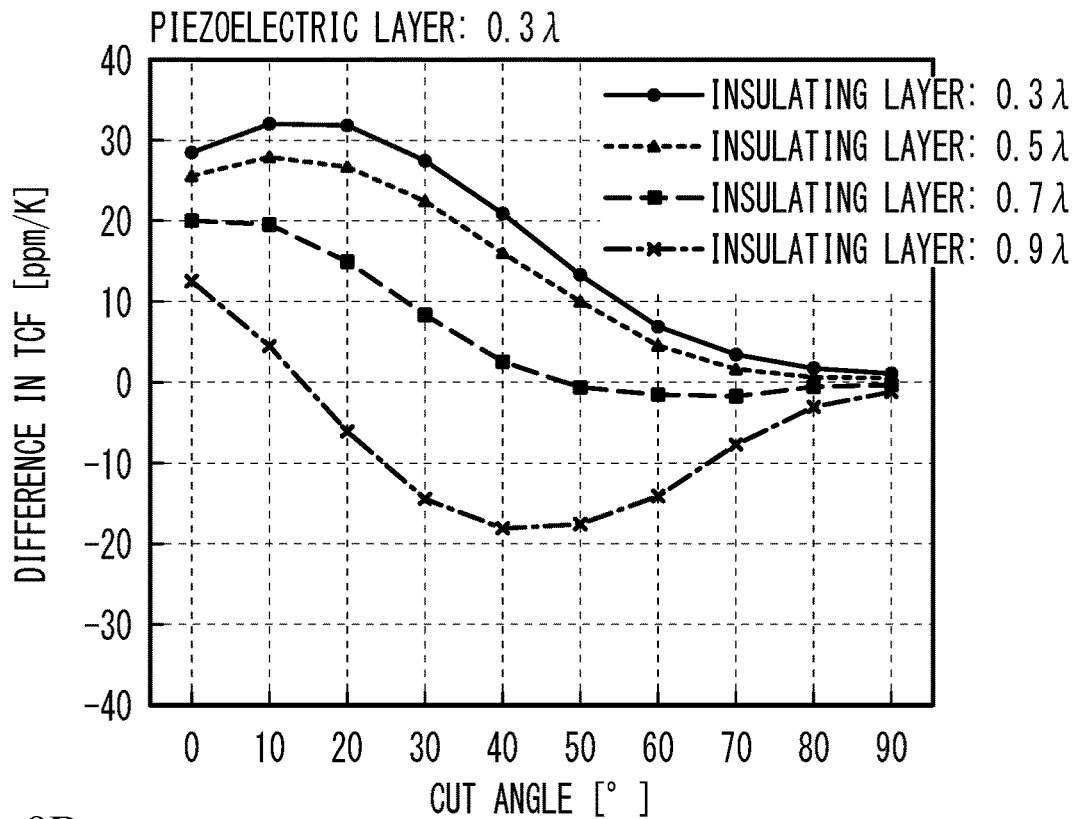
FIG. 9A and FIG. 9B are graphs of the difference between the temperature coefficient of the resonant frequency and the temperature coefficient of the antiresonant frequency versus the cut angle of the piezoelectric layer when the thickness of the insulating layer is varied.
Figure 9B:
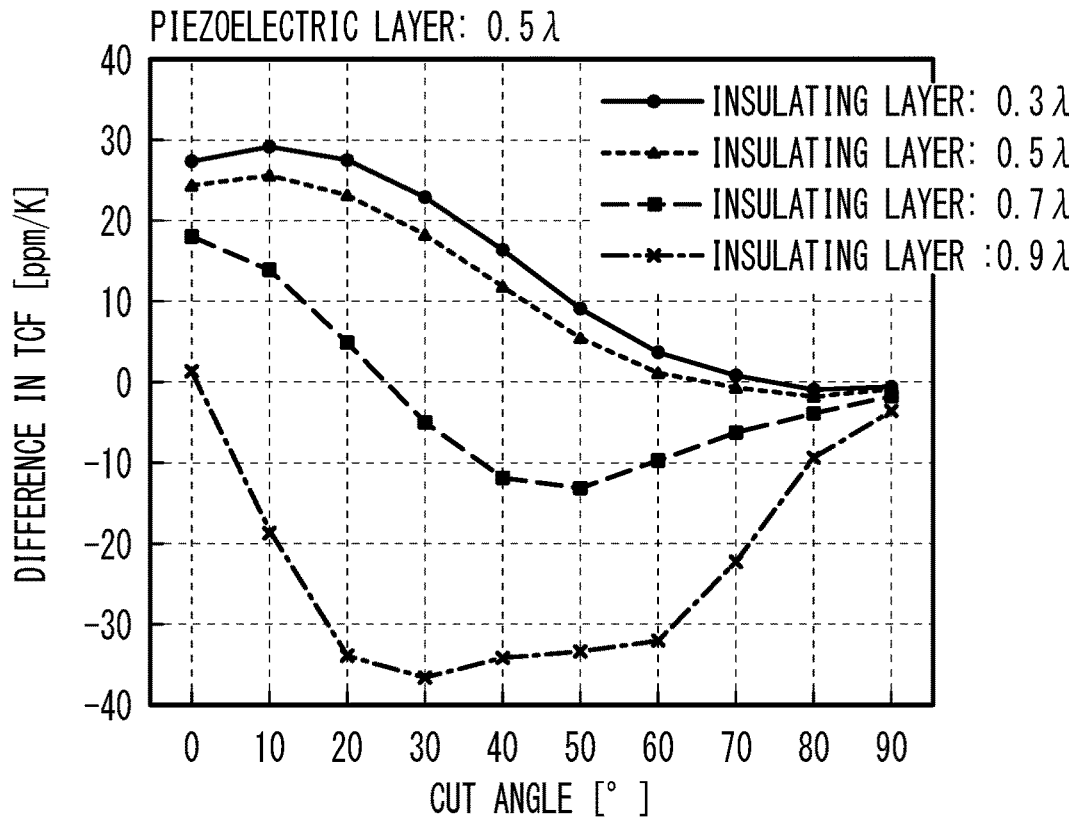

FIG. 9A and FIG. 9B are graphs of the difference between the temperature coefficient of the resonant frequency and the temperature coefficient of the antiresonant frequency versus the cut angle of the piezoelectric layer when the thickness of the insulating layer is varied. The horizontal axis represents the cut angle of the piezoelectric layer 12, and the vertical axis represents the difference (fr−fa) between the temperature coefficient of the resonant frequency fr and the temperature coefficient of the antiresonant frequency fa. FIG. 9A presents results of the simulation conducted under the conditions identical to those in FIG. 6 and FIG. 7 except in that the thickness of the piezoelectric layer 12 was fixed to 0.3λ, and the thickness of the insulating layer 11 was varied to 0.3λ, 0.5λ, 0.7λ, and 0.9λ. FIG. 9B presents results of the simulation conducted under the conditions identical to those in FIG. 6 and FIG. 7 except in that the thickness of the piezoelectric layer 12 was fixed to 0.5λ and the thickness of the insulating layer 11 was varied to 0.3λ, 0.5λ, 0.7λ, and 0.9λ.

FIG. 9A and FIG. 9B reveal that there is an appropriate range of the cut angle of the piezoelectric layer 12 within which the absolute value of the difference in TCF is small regardless of the thickness of the insulating layer 11. To reduce the absolute value of the difference in TCF when the cut angle of the piezoelectric layer 12 is greater than 50°, the thickness of the insulating layer 11 is preferably 0.1λ or greater and 0.7λ or less, more preferably 0.3λ or greater and 0.7λ or less, further preferably 0.5λ or greater and 0.7λ or less. In addition, since FIG. 9A presents the simulation results when the thickness of the piezoelectric layer 12 is 0.3λ and FIG. 9B presents the simulation results when the thickness of the piezoelectric layer 12 is 0.5λ, the thickness of the piezoelectric layer 12 is preferably 0.2λ or greater and 0.6λ or less, more preferably 0.3λ or greater and 0.5λ or less.

Figure 10A:
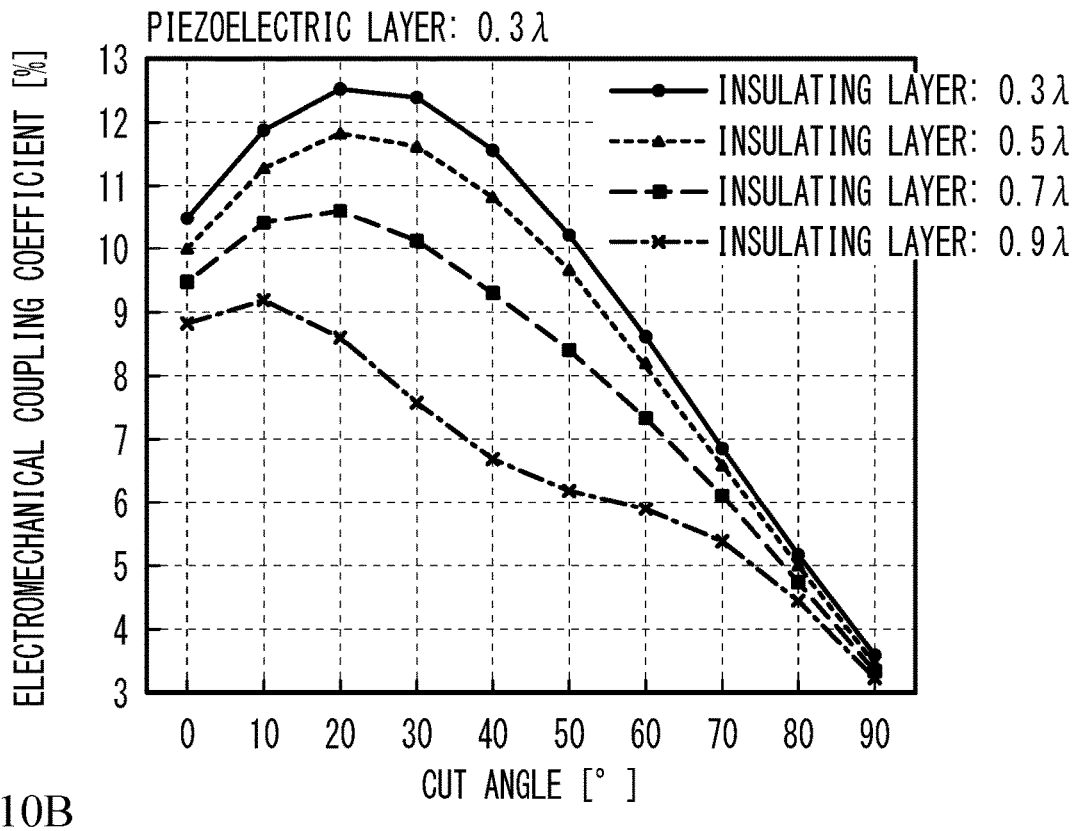
FIG. 10A and FIG. 10B are graphs of the electromechanical coupling coefficient versus the cut angle of the piezoelectric layer when the thickness of the insulating layer is varied.
Figure 10B:
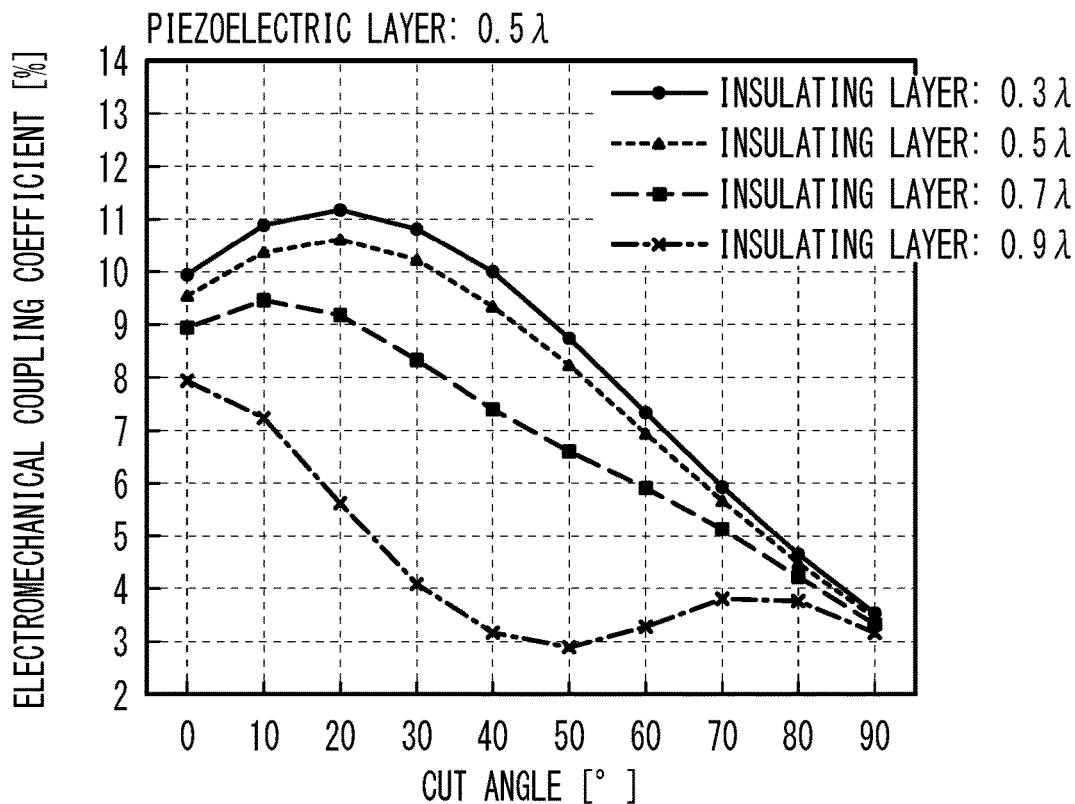

FIG. 10A and FIG. 10B are graphs of the electromechanical coupling coefficient versus the cut angle of the piezoelectric layer when the thickness of the insulating layer is varied. The horizontal axis represents the cut angle of the piezoelectric layer 12, and the vertical axis represents the electromechanical coupling coefficient. FIG. 10A presents results of the simulation conducted under the conditions identical to those in FIG. 6 and FIG. 7 except in that the thickness of the piezoelectric layer 12 was fixed to 0.3λ and the thickness of the insulating layer 11 was varied to 0.3λ, 0.5λ, 0.7λ, and 0.9λ. FIG. 10B presents results of the simulation conducted under the conditions identical to those in FIG. 6 and FIG. 7 except in that the thickness of the piezoelectric layer 12 was fixed to 0.5λ, and the thickness of the insulating layer 11 was varied to 0.3λ, 0.5λ, 0.7λ, and 0.9λ.

FIG. 10A and FIG. 10B reveal that as the thickness of the insulating layer 11 increases, the electromechanical coupling coefficient decreases. Thus, to inhibit reduction in electromechanical coupling coefficient, the thickness of the insulating layer 11 is preferably 0.7λ or less, more preferably 0.5λ or less, further preferably 0.4λ or less.

The simulation results presented in FIG. 6 to FIG. 10B reveal that the thickness of the insulating layer 11 is preferably 0.1λ or greater and 0.7λ or less and the thickness of the piezoelectric layer 12 is preferably 0.2λ or greater and 0.6λ or less to ensure the electromechanical coupling coefficient and reduce the difference in TCF. The thickness of the insulating layer 11 is more preferably 0.3λ or greater and 0.7λ or less, and the thickness of the piezoelectric layer 12 is more preferably 0.3λ or greater and 0.5λ or less. In other words, the thickness of the insulating layer 11 is preferably equal to or greater than 0.1 times the average pitch of the electrode fingers 15 of one of the comb-shaped electrodes 18 and equal to or less than 0.7 times the average pitch of the electrode fingers 15 of the one of the comb-shaped electrodes 18, while the thickness of the piezoelectric layer 12 is preferably equal to or greater than 0.2 times the average pitch of the electrode fingers 15 of the one of the comb-shaped electrodes 18 and equal to or less than 0.6 times the average pitch of the electrode fingers 15 of the one of the comb-shaped electrodes 18. The thickness of the insulating layer 11 is more preferably equal to or greater than 0.3 times the average pitch of the electrode fingers 15 of the one of the comb-shaped electrodes 18 and equal to or less than 0.7 times the average pitch of the electrode fingers 15 of the one of the comb-shaped electrodes 18, while the thickness of the piezoelectric layer 12 is more preferably equal to or greater than 0.3 times the average pitch of the electrode fingers 15 of the one of the comb-shaped electrodes 18 and equal to or less than 0.5 times the average pitch of the electrode fingers 15 of the one of the comb-shaped electrodes 18.

To ensure the electromechanical coupling coefficient and reduce the difference in TCF, the thickness of the insulating layer 11 may be 0.3λ or greater and 0.5λ or less, may be 0.4λ or greater and 0.7λ or less, or may be 0.5λ or greater and 0.7λ or less. The thickness of the piezoelectric layer 12 may be 0.3λ or greater and 0.4λ or less.

The simulation results presented in FIG. 6 to FIG. 10B are results in the case where the insulating layer 11 is a silicon dioxide ($SiO_2$) layer, but it is considered that the same results are obtained when the insulating layer 11 is a fluorine-added silicon oxide (SiOF) layer or a nitrogen-added silicon oxide (SiON) layer containing silicon oxide (SiO). Therefore, the insulating layer 11 is not limited to a silicon dioxide layer, and may be any insulating layer containing silicon oxide. A layer containing silicon oxide means a layer containing Si and O at a concentration of 50 atomic % or greater in total, preferably a layer containing Si and O at a concentration of 80 atomic % or greater in total.

Second Embodiment

Figure 11:
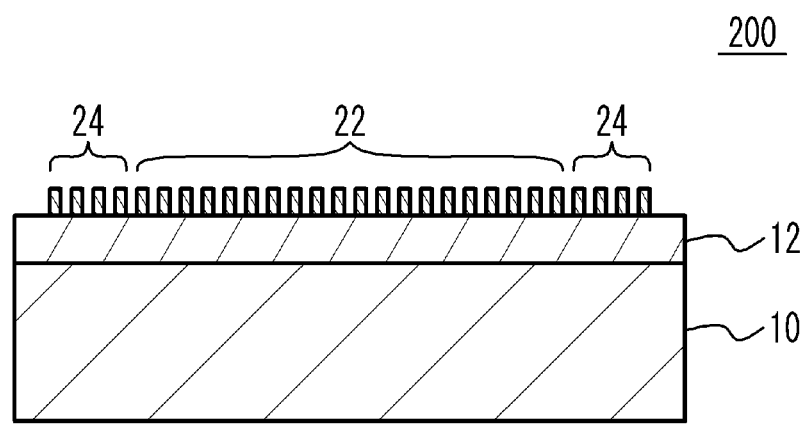
FIG. 11 is a cross-sectional view of an acoustic wave resonator in accordance with a second embodiment.

FIG. 11 is a cross-sectional view of an acoustic wave resonator in accordance with a second embodiment. As illustrated in FIG. 11, in an acoustic wave resonator 200 in accordance with the second embodiment, no insulating layer 11 is provided, and the piezoelectric layer 12 is bonded on the support substrate 10. The piezoelectric layer 12 may be directly bonded on the support substrate 10 or indirectly bonded on the support substrate 10 with a bonding layer or other layers interposed therebetween. The remaining structure is the same as that of the first embodiment, and the description thereof is thus omitted. The acoustic wave resonator 200 of the second embodiment is formed using the method identical to the method for forming the acoustic wave resonator 100 of the first embodiment except in that a piezoelectric substrate is bonded on the support substrate 10 using the surface activation method.

As described in the first embodiment, the surface acoustic wave propagates through the region from the surface of the piezoelectric layer 12 to 2λ in depth. That is, when the thickness of the piezoelectric layer 12 is greater than 2λ, the region deeper than 2λ from the surface of the piezoelectric layer 12 is the region through which the surface acoustic wave does not propagate. Therefore, when no insulating layer 11 is interposed between the support substrate 10 and the piezoelectric layer 12, the thickness of the piezoelectric layer 12 is adjusted to be 2λ or less to reduce the size of the acoustic wave resonator. In other words, the average pitch of the electrode fingers 15 of one of the comb-shaped electrodes 18 is adjusted to be equal to or greater than ½ of the thickness of the piezoelectric layer 12. In this case, by adjusting the cut angle of the piezoelectric layer 12 to be within a range of greater than 50° and less than 150° as illustrated in FIG. 8A, the absolute value of the difference between the temperature coefficient of the resonant frequency fr and the temperature coefficient of the antiresonant frequency fa of the acoustic wave resonator can be reduced.

Even when no insulating layer 11 is provided, as in the first embodiment, to ensure the electromechanical coupling coefficient and reduce the difference in TCF, the cut angle of the piezoelectric layer 12 is preferably greater than 50° and 90° or less, more preferably 55° or greater and 90° or less, further preferably greater than 50° and 70° or less, yet further preferably 55° or greater and 70° or less. In addition, to ensure the electromechanical coupling coefficient and further reduce the difference in TCF, the cut angle of the piezoelectric layer 12 may be 60° or greater and 90° or less, may be 60° or greater and 80° or less, or may be 70° or greater and 90° or less.

To reduce the size of the acoustic wave resonator, the thickness of the piezoelectric layer 12 may be 1.8λ or less, may be 1.5λ or less, or may be 1.0λ or less.

Third Embodiment

Figure 12:
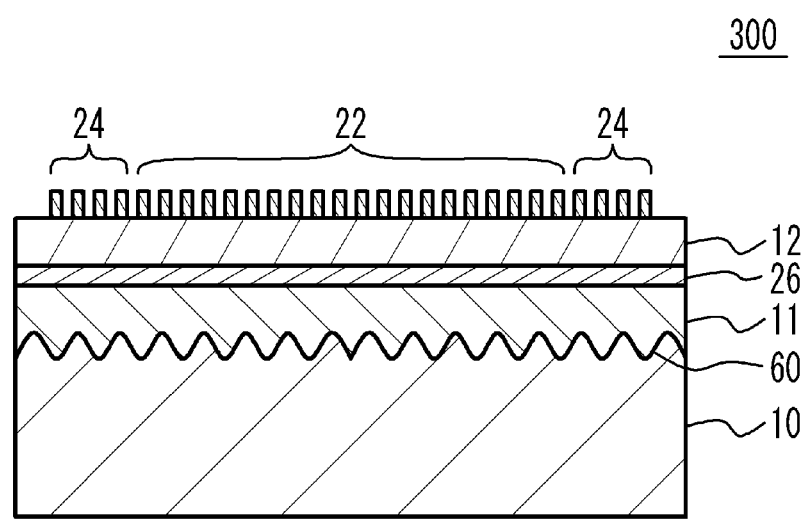
FIG. 12 is a cross-sectional view of an acoustic wave resonator in accordance with a third embodiment.

FIG. 12 is a cross-sectional view of an acoustic wave resonator in accordance with a third embodiment. As illustrated in FIG. 12, in an acoustic wave resonator 300 in accordance with the third embodiment, a bonding layer 26 is interposed between the insulating layer 11 and the piezoelectric layer 12. The bonding layer 26 is formed of, for example, alumina, silicon, or aluminum nitride, and has a thickness of, for example, 1 nm to 100 nm. Recesses and protrusions are formed on a boundary face 60 between the support substrate 10 and the insulating layer 11. The recesses and protrusions may be formed regularly or formed irregularly. The arithmetic average roughness Ra of the boundary face 60 is, for example, 10 nm or greater and 1000 nm or less, more preferably 50 nm or greater and 500 nm or less, further preferably 100 nm or greater and 300 nm or less. The recesses and protrusions on the boundary face 60 are formed by removing the upper part of the support substrate 10 by etching or sandblasting using a mask layer formed on the support substrate 10 as a mask, and then forming the insulating layer 11 on the support substrate 10. For example, when the support substrate 10 is a sapphire substrate, the upper part of the support substrate 10 may be removed by dry etching using chlorine-based gas. An etching liquid and an etching gas are appropriately selected according to the material of the support substrate 10. The remaining structure is the same as that of the first embodiment, and the description thereof is thus omitted.

As in the third embodiment, the bond strength between the insulating layer 11 and the piezoelectric layer 12 is enhanced by providing the bonding layer 26 between the insulating layer 11 and the piezoelectric layer 12. Formation of the recesses and protrusions on the boundary face 60 between the support substrate 10 and the insulating layer 11 allows the acoustic wave excited by the IDT 22 to be easily confined in the piezoelectric layer 12 and the insulating layer 11. In addition, spurious emissions due to the bulk wave are reduced.

Fourth Embodiment

Figure 13A:
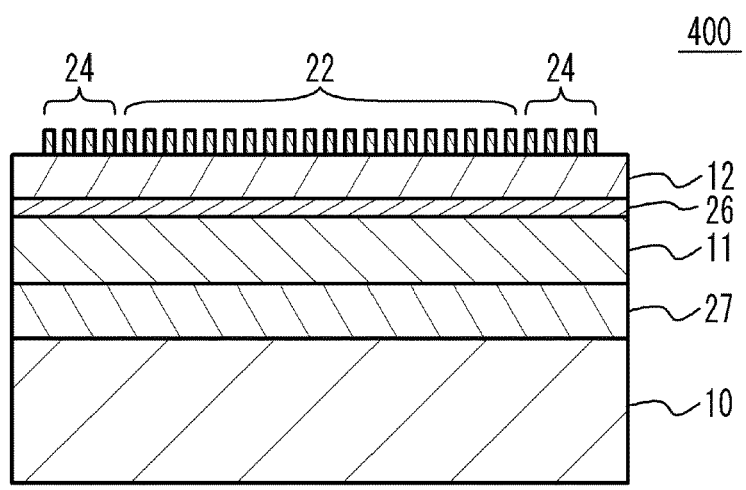
FIG. 13A to FIG. 13C are cross-sectional views of acoustic wave resonators in accordance with a fourth embodiment, a first variation of the fourth embodiment, and a second variation of the fourth embodiment, respectively.
Figure 13B:
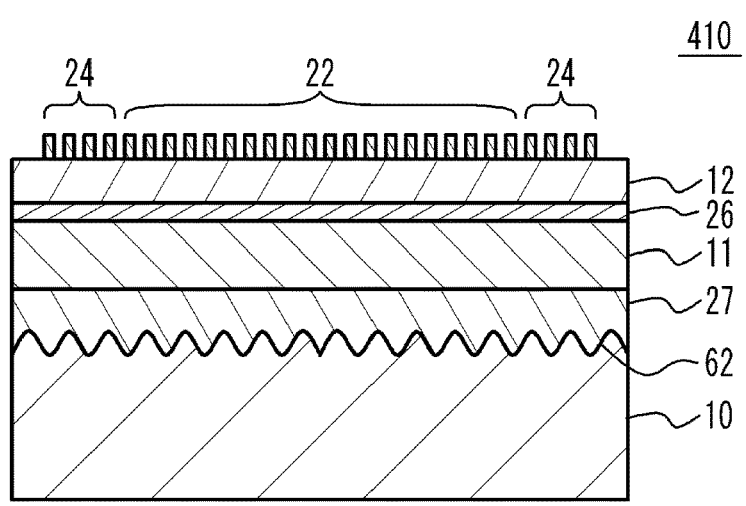
Figure 13C:
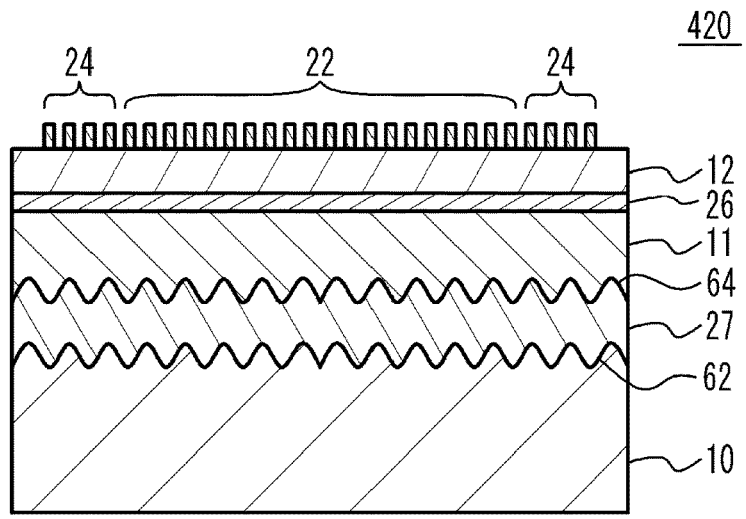

FIG. 13A to FIG. 13C are cross-sectional views of acoustic wave resonators in accordance with a fourth embodiment, a first variation of the fourth embodiment, and a second variation of the fourth embodiment, respectively. As illustrated in FIG. 13A, in an acoustic wave resonator 400 of the fourth embodiment, the bonding layer 26 is interposed between the insulating layer 11 and the piezoelectric layer 12, and a boundary layer 27 is interposed between the support substrate 10 and the insulating layer 11. The acoustic velocity of the bulk wave in the boundary layer 27 is greater than that of the bulk wave in the piezoelectric layer 12 and the insulating layer 11. The boundary layer 27 is formed of, for example, alumina, aluminum nitride, silicon, silicon nitride, or silicon carbide. The thickness of the boundary layer 27 is, for example, 0.5λ or greater, further preferably 1.5λ or greater. The remaining structure is the same as that of the first embodiment, and the description thereof is thus omitted.

As in the fourth embodiment, when the boundary layer 27 that is a high acoustic velocity layer is interposed between the support substrate 10 and the insulating layer 11, the acoustic wave excited by the IDT 22 is easily confined within the piezoelectric layer 12 and the insulating layer 11.

As illustrated in FIG. 13B, in an acoustic wave resonator 410 of the first variation of the fourth embodiment, recesses and protrusions are formed on a boundary face 62 between the support substrate 10 and the boundary layer 27. The recesses and protrusions may be formed regularly or may be formed irregularly. The arithmetic average roughness Ra of the boundary face 62 is, for example, 10 nm or greater and 1000 nm or less, preferably 50 nm or greater and 500 nm or less, further preferably 100 nm or greater and 300 nm or less. The remaining structure is the same as that of the fourth embodiment, and the description thereof is thus omitted.

Formation of recesses and protrusions on the boundary face 62 between the support substrate 10 and the boundary layer 27 reduces spurious emissions due to the bulk wave.

As illustrated in FIG. 13C, in an acoustic wave resonator 420 in accordance with the second variation of the fourth embodiment, recesses and protrusions are formed on the boundary face 62 between the support substrate 10 and the boundary layer 27, and recesses and protrusions are formed on the boundary face 64 between the boundary layer 27 and the insulating layer 11. The recesses and protrusions may be formed regularly or may be formed irregularly. The arithmetic average roughness Ra of each of the boundary faces 62 and 64 is, for example, 10 nm or greater and 1000 nm or less, preferably 50 nm or greater and 500 nm or less, further preferably 100 nm or greater and 300 nm or less. The remaining structure is the same as that of the fourth embodiment, and the description thereof is thus omitted. Formation of recesses and protrusions on the boundary face 64 between the boundary layer 27 and the insulating layer 11 allows the acoustic wave excited by the IDT 22 to be easily confined in the piezoelectric layer 12 and the insulating layer 11. In addition, spurious emissions due to the bulk wave are reduced.

Fifth Embodiment

Figure 14:
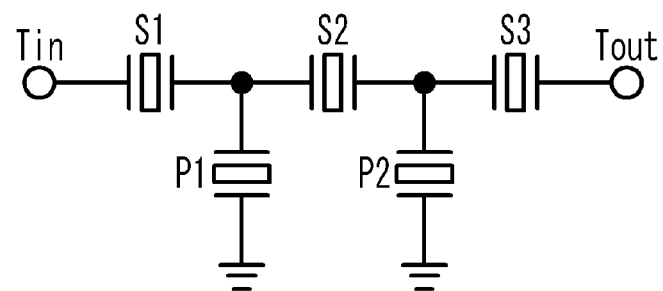
FIG. 14 is a circuit diagram of a filter in accordance with a fifth embodiment.

FIG. 14 is a circuit diagram of a filter in accordance with a fifth embodiment. As illustrated in FIG. 14, a filter 500 of the fifth embodiment includes one or more series resonators S1 to S3 connected in series between an input terminal Tin and an output terminal Tout. One or more parallel resonators P1 and P2 are connected in parallel between the input terminal Tin and the output terminal Tout. Any one of the acoustic wave resonators of the first embodiment to the second variation of the fourth embodiment may be used for at least one of one or more series resonators S1 to S3 and one or more parallel resonators P1 and P2. The number of resonators of the ladder-type filter may be appropriately selected.

Sixth Embodiment

Figure 15:
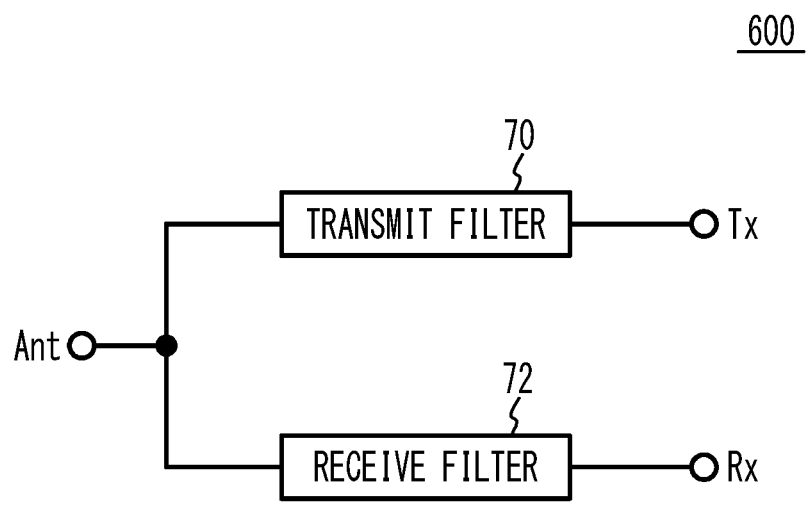
FIG. 15 is a circuit diagram of a duplexer in accordance with a sixth embodiment.

FIG. 15 is a circuit diagram of a duplexer in accordance with a sixth embodiment. As illustrated in FIG. 15, in a duplexer 600 of the sixth embodiment, a first end of a transmit filter 70 is connected to a common terminal Ant, and a second end of the transmit filter 70 is connected to the transmit terminal Tx. A first end of a receive filter 72 is connected to the common terminal Ant, and a second end of the receive filter 72 is connected to a receive terminal Rx. The transmit filter 70 transmits signals in the transmit band to the common terminal Ant as a transmission signal among high-frequency signals input from the transmit terminal Tx, and suppresses signals with other frequencies. The receive filter 72 transmits signals in the receive band to the receive terminal Rx as a reception signal among high-frequency signals input from the common terminal Ant, and suppresses signals with other frequencies. At least one of the transmit filter 70 and the receive filter 72 may be the filter of the fifth embodiment. A duplexer is described as an example of the multiplexer, but the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave resonator comprising:
    a support substrate;
    a piezoelectric layer that is disposed on the support substrate and is a rotated Y-cut X-propagation lithium tantalate of which a cut angle is within a range of 70° or greater and 90° or less; and
    a pair of comb-shaped electrodes disposed on the piezoelectric layer, each of the comb-shaped electrodes including a plurality of electrode fingers, an average pitch of the electrode fingers of one of the comb-shaped electrodes being equal to or greater than ½ of a thickness of the piezoelectric layer.

2. The acoustic wave resonator according to claim 1, further comprising an insulating layer that is interposed between the support substrate and the piezoelectric layer, contains silicon oxide, and has a temperature coefficient of an elastic constant that is opposite in sign to a temperature coefficient of an elastic constant of the piezoelectric layer, wherein the average pitch of the electrode fingers of one of the comb-shaped electrodes is equal to or greater than ½ of a distance between an upper surface of the piezoelectric layer and a lower surface of the insulating layer.

3. The acoustic wave resonator according to claim 2, wherein the thickness of the insulating layer is equal to or greater than 0.1 times the average pitch of the electrode fingers of the one of the comb-shaped electrodes and equal to or less than 0.7 times the average pitch of the electrode fingers of the one of the comb-shaped electrodes,
wherein a thickness of the piezoelectric layer is equal to or greater than 0.2 times the average pitch of the electrode fingers of the one of the comb-shaped electrodes and equal to or less than 0.6 times the average pitch of the electrode fingers of the one of the comb-shaped electrodes.

4. The acoustic wave resonator according to claim 2, wherein the thickness of the insulating layer is equal to or greater than 0.3 times the average pitch of the electrode fingers of the one of the comb-shaped electrodes and equal to or less than 0.7 times the average pitch of the electrode fingers of the one of the comb-shaped electrodes,
wherein a thickness of the piezoelectric layer is equal to or greater than 0.3 times the average pitch of the electrode fingers of the one of the comb-shaped electrodes and equal to or less than 0.5 times the average pitch of the electrode fingers of the one of the comb-shaped electrodes.

5. The acoustic wave resonator according to claim 2, wherein the insulating layer is a silicon dioxide layer.

6. The acoustic wave resonator according to claim 1, wherein the average pitch of the electrode fingers of the one of the comb-shaped electrodes is a value calculated by dividing a length of the one of the comb-shaped electrodes in a direction in which the electrode fingers are arranged by the number of the electrode fingers.

7. The acoustic wave resonator according to claim 1, wherein the support substrate is a sapphire substrate, an alumina substrate, a silicon substrate, a spinel substrate, a crystal substrate, a quartz substrate, or a silicon carbide substrate.

8. A filter comprising:
the acoustic wave resonator according to claim 1.

9. A multiplexer comprising:
the filter according to claim 8.

* * * * *